United States Patent [19]

Hayashi

[11] Patent Number: 5,477,502

[45] Date of Patent: Dec. 19, 1995

[54] SEMICONDUCTOR RAM DEVICE WITH A SINGLE WRITE SIGNAL LINE FOR ONE COLUMN IN MEMORY CELL ARRAY AND FOR ONE PORT

[75] Inventor: Katsuyoshi Hayashi, Kanagawa, Japan

[73] Assignee: NEC Corporation, Tokyo, Japan

[21] Appl. No.: 272,033

[22] Filed: Jul. 8, 1994

[30] Foreign Application Priority Data

Jul. 8, 1993 [JP] Japan .................................. 5-168285

[51] Int. Cl.$^6$ .................................................. G11C 7/00
[52] U.S. Cl. ..................................... 365/230.05; 365/156
[58] Field of Search ................................ 365/230.05, 154, 365/189.05, 156, 190, 189.04

[56] References Cited

U.S. PATENT DOCUMENTS 4,777,623 10/1988 Shimazu ................................... 365/154
5,260,908 11/1993 Ueno ................................... 365/230.05

Primary Examiner—A. Zarabian
Attorney, Agent, or Firm—Foley & Lardner

[57] ABSTRACT

In a semiconductor random access memory device having a memory cell array, each of the memory cells includes a flipflop circuit having two opposite terminals as a data holding element. The flipflop circuit is applied with "1" and "0" signals to the two opposite terminals, those applied signals are held at the opposite terminals, respectively. In order to small size the memory device by avoiding use of a pair of write signal lines for writing data signal to the memory cell, the memory cell is provided with an inverter circuit connecting between the two terminals of the flipflop circuit. A data signal is applied to one of two terminals through a single write signal line, while is applied to the other terminal as an inverted signal through the inverter circuit.

11 Claims, 7 Drawing Sheets

SEMICONDUCTOR RAM DEVICE WITH A SINGLE WRITE SIGNAL LINE FOR ONE COLUMN IN MEMORY CELL ARRAY AND FOR ONE PORT

BACKGROUND OF THE INVENTION

The present invention relates to a semiconductor random access memory (RAM) device and, in particular, to an improvement in application of a write data signal to memory cells which enables to small-size the RAM device of, particularly, a multiport type.

In the semiconductor RAM device, there are a single port type having a single port through which the RAM is accessed by a single processor and a multiport type having a plurality of ports through which the RAM can commonly be accessed by a plurality of processors.

Generally speaking, a semiconductor RAM device has a memory cell array comprising a plurality of memory cells arranged in rows and columns of a matrix. Each of the memory cells comprises a data holding element which is, usually a flipflop circuit having a pair of terminals. In order to write a data signal to the data holding element, a high level or "1" signal and a low level or "0" signal are simultaneously applied to the pair of terminals. It is provided that when "1" signal is applied to first one of the pair of terminals while "0" signal being applied to the other or second one of the pair of terminals, the data holding element holds the data signals of "1" and "0" at the first and the second terminals, respectively. On the other hand, when "0" signal is applied to the first terminal while "1" signal being applied to the second terminal, the data holding element holds the data signal of "0" and "1" at the first and the second terminals, respectively. The memory cell array further comprises a plurality of word lines extending along the rows and a plurality of digit or bit lines extending along the columns.

In a typical RAM of the single port type, a single word line is commonly connected to memory cells in each of the rows. One pair of the digit lines are commonly connected to the memory cells in each of the columns. In each of the memory cells, the two digit lines of one pair are connected to the first terminal and the second terminal of the data holding element through a first and a second gate, respectively. The first and the second gates are commonly connected to the single word line. When the single word line is activated, the first and second gates are opened and the two digit lines are electrically connected to the first and second terminals through the first and the second gates opened, respectively. Thus, the "0" and "1" signals are read out from the data holding element in the memory cell onto the two digit lines, respectively. Alternatively, when the "0" and "1" signals are applied to the digit lines, respectively, "0" and "1" signals are held at the two terminals of the data holding element, respectively. Thus, the pair of two digit lines for one column is used for transmission of both of the write data signal and the read data signal, that is, used as a write signal line pair and also as a read signal line pair.

In another known single port type RAM, an additional word line is provided for each of the rows and additional column line is provided for each of the columns. In this type of RAM, the additional word line and the additional column line are only used for reading the data signal. Therefore, the additional word line and the additional column line are referred to as a reading word line and a read signal line, respectively. The existing pair of digit lines and the corresponding word line are used only for writing data signals. The pair of digit lines are, therefore, referred to as a write signal line pair and the corresponding word line is referred to as a writing word line.

In any one of the single port type RAM devices, each one of memory cells is formed to have the first and the second terminals of the data holding element which are disposed at opposite sides of the data holding element in the row direction. Accordingly, the first and the second gates are disposed at the opposite sides of the data holding element outwardly from the first and the second terminals. Therefore, the two digit lines of one pair are disposed outward of the first and the second gates. This means that the size of the memory cell is relatively large in the row direction. Further, the digit lines of one memory cell are disposed adjacent digit lines of other memory cells adjacent in the row direction. Accordingly, there is a problem of cross talk between the adjacent digit lines.

In order to avoid the cross talk, a space between adjacent columns must be sufficiently enlarged. This results in large size of the memory cell array. Alternatively, a ground line is disposed in the space between adjacent columns so that the space can be reduced. However, reduction of the size of the memory cell array is limited by provision of the ground lines between adjacent memory cells.

In the semiconductor RAM of the multiport type, a number of the writing word lines and a number of the reading word lines for each row of the memory cell array are determined by requirement of processors connected to the plurality of ports. Numbers of the corresponding write signal line pairs and read signal lines for each column of the array are determined in dependence of the numbers of the writing and reading word lines for each row.

When only one of processors requires for writing data into the RAM and the other processors require only to read the data from the RAM, one writing word line and one write signal line pair are provided for one row and one column of the array, respectively. This has a problem similar to the single port RAM as described above.

When a plurality of processors, for example, two processors require for writing data into the RAM, two writing word lines and two write signal line pairs are provided for one row and for one column of the matrix array, respectively. In this case, since the digit lines of one pair are disposed adjacent to digit lines of another pair in one of memory cells, there is a further cross talk problem between adjacent digit lines of different pairs for different ports. In order to resolve the problem, ground lines are also provided between adjacent digit lines of different write signal line pairs. This results in increase of size of each memory cell and therefore of RAM device itself.

SUMMARY OF THE INVENTION

Accordingly, it is a fundamental object of the present invention to provide a semiconductor RAM device having a memory cell array wherein a single line is used for transmission of a write data signal from one port to memory cells in one column, so as to reduce the size of each memory cell and the RAM device with avoiding a cross talk problem.

It is another object to provide a single port RAM device with a reduced size by use of a single line for transmission of the write data signal to memory cells in each one of rows in the memory cell array.

It is a further object to provide a multiport type RAM device with a reduced size by use of a single line for transmission of the write data signal from one port to memory cells in each one of rows in the memory cell array.

In order to realize the above-mentioned objects, this invention attempts to use of an inverter circuit which connects between the opposite terminals of the data holding flipflop circuit. Thus, a single write signal for one port can be used in each column.

The present invention can be applicable to a semiconductor random access memory device having a memory cell array. The memory cell array comprises: a plurality of memory cells arranged in rows and columns of a matrix, each memory cell comprising a data holding element having two opposite terminals, a high level and a low level signal being simultaneously applied to the two terminals and held at the terminals, inverter circuit means connecting a first one of the two terminals with a remaining one, as a second terminal, of said terminals, and gate means connected to the first terminal; a writing word line extending along each of the rows and being connected to the gate means in each of the memory cells in each of the rows for controlling open and close of the gate means, the gate means being opened when the writing word line is activated; a write signal line means extending as a single line along of the column, the write signal line means of the single line being connected to the gate means in each of memory cells in each of the columns, whereby a data signal transmitting on the single line is applied to the first terminal of the data holding element in each of the memory cells through the gate means opened, while the data signal being inverted by the inverter circuit means and applied to the second terminal of the data holding means.

DESCRIPTION OF THE PREFERRED EMBODIMENTS

Prior to description of embodiments of the present invention, typical known semiconductor RAM devices will be described for the sake of better understanding of the present invention.

Figure 1:
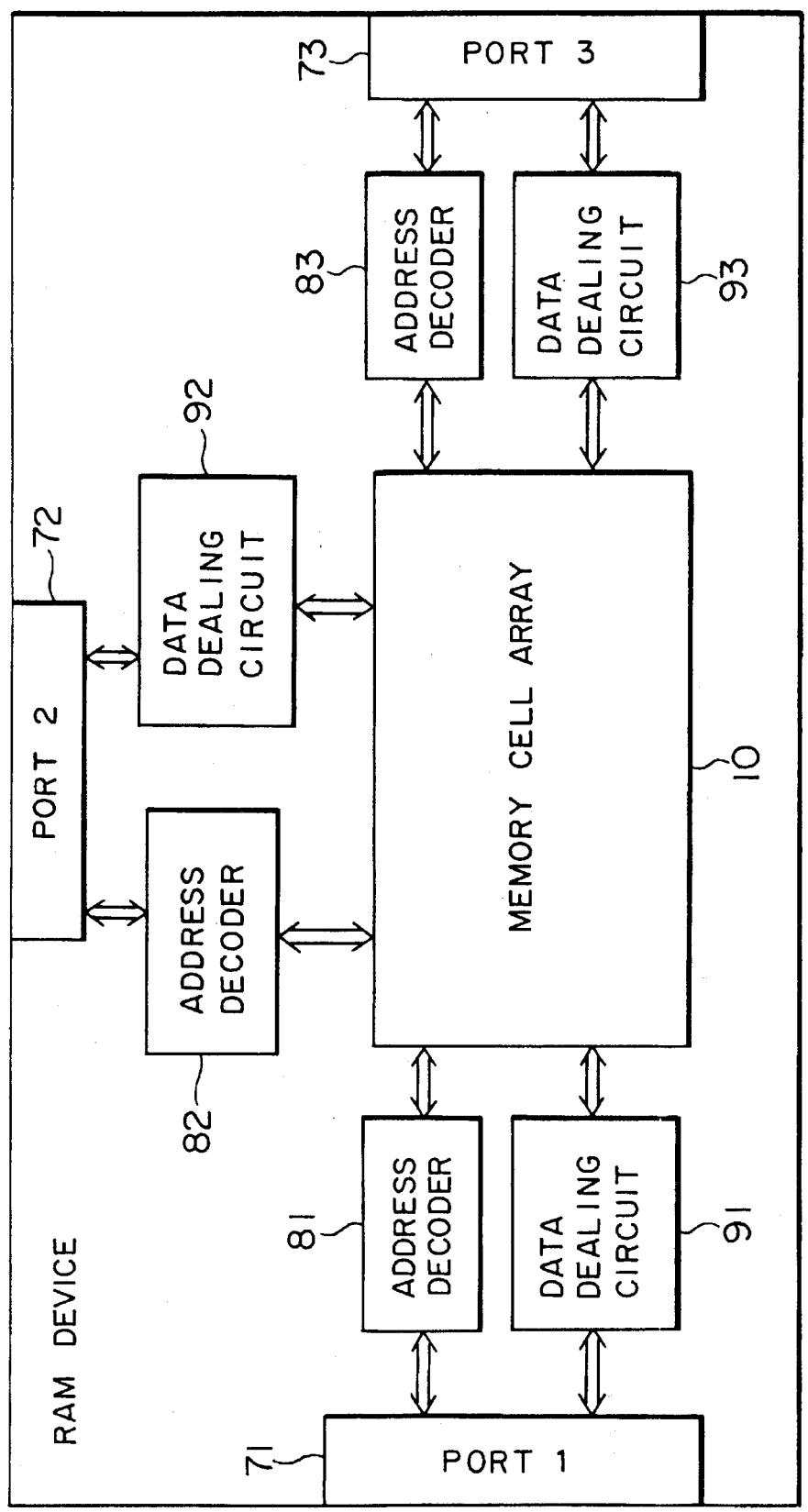
FIG. 1 shows a block diagram of a multiport RAM device.

Referring to FIG. 1, a multiport type RAM device comprises a plurality of ports (three ports 71, 72 and 73 are shown) to be connected to processors (not shown), address decoders 81, 82, and 83 connected to corresponding ports 71, 72, and 73, data dealing circuits 91, 92 and 93 connected to the corresponding ports 71, 72, and 73, and a memory cell array 10.

Each of address decoders 81, 82, and 83 receives address data from the processors through the corresponding one of ports 71, 72, and 73 and decodes a row address and a column address to select the corresponding row and column in the array 10. Each of data dealing circuits 91, 92, and 93 perform data reception and transmission from the corresponding port 71–73 to the memory cell array 10 and/or from the memory cell array 10 to the corresponding port 71–73.

The single port RAM device comprises only one port, the memory cell array, one address decoder, and one data dealing circuit.

Figure 2:
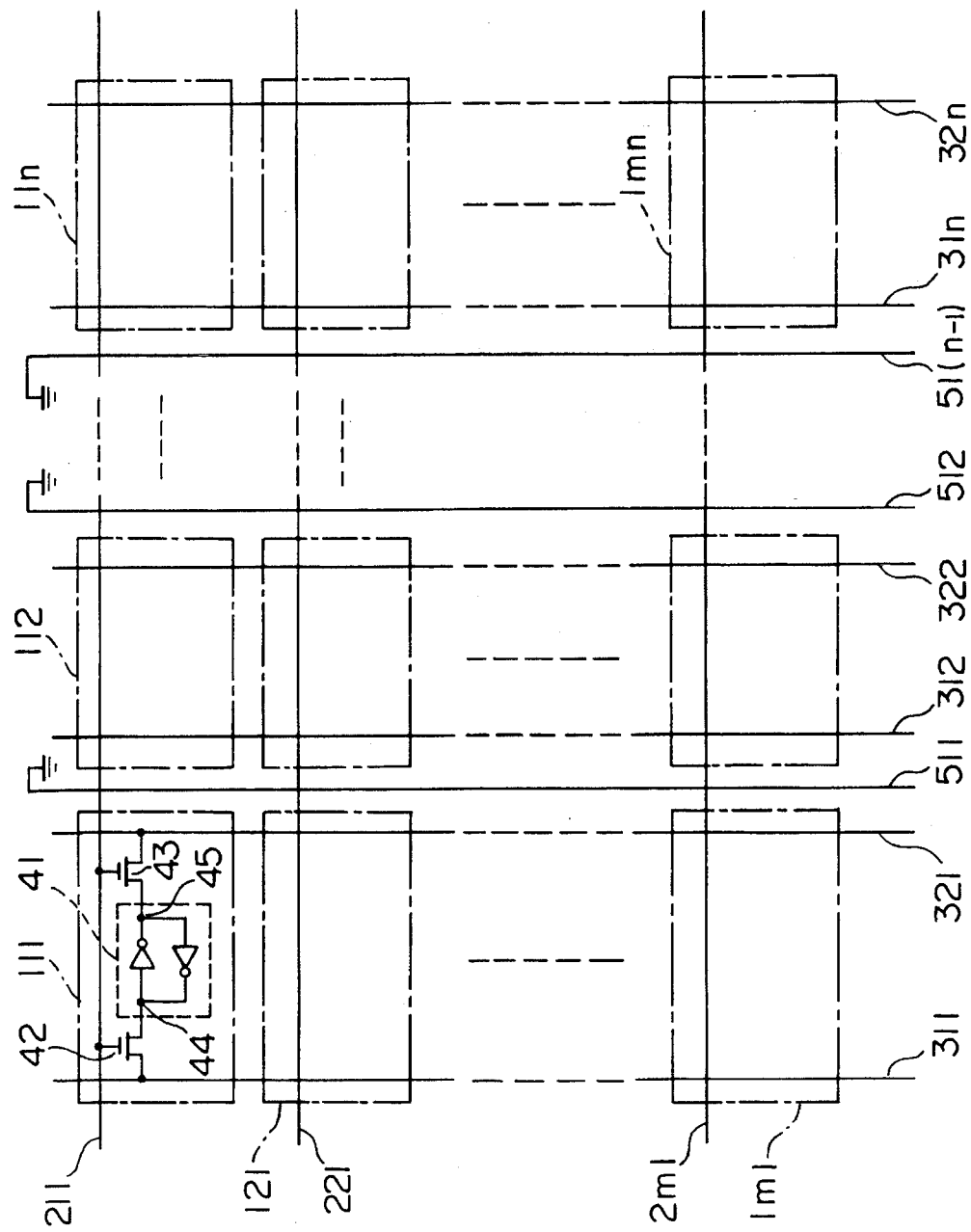
FIG. 2 shows a circuit diagram of a memory cell array of a known semiconductor RAM of a single port type.

Referring to FIG. 2, the memory cell array of a single port type RAM shown therein has a plurality of memory cells 1ll to 1mn (m and n are integer larger than 1) arranged in m rows and n columns of the matrox. a word lines 2ll to 2ml extending along m rows, respectively, and n pairs of digit lines 3ll to 32n extending along n columns, respectively. Those memory cells have a similar circuit structure. Therefore, one memory cell shown at ll is representatively shown in detail in the figure and is described. That is, each of the memory cells comprises a flipflop circuit 41 as the data holding element and a first and second gates 42 and 43. The flipflop circuit 41 is shown by a combination of two inverter circuits or NOT gates and has first and second terminals 44 and 45 at its opposite sides. The first and the second gates 42 and 43 are connected to the first and the second terminals 44 and 45 and are; therefore, disposed at both sides or the flipflop circuit 41. Accordingly, paired two digit lines 31l and 32l, to 31n and 32n of each column are also disposed at its opposite sides. Thus, cross talk is a problem between adjacent digit lines in adjacent columns. In order to prevent the cross talk, ground lines 51l to 51(n–l) are disposed to extend spaces between adjacent columns. This results in increase of the size of the memory cell array and the RAM device, as described in preamble of the description.

Figure 3:
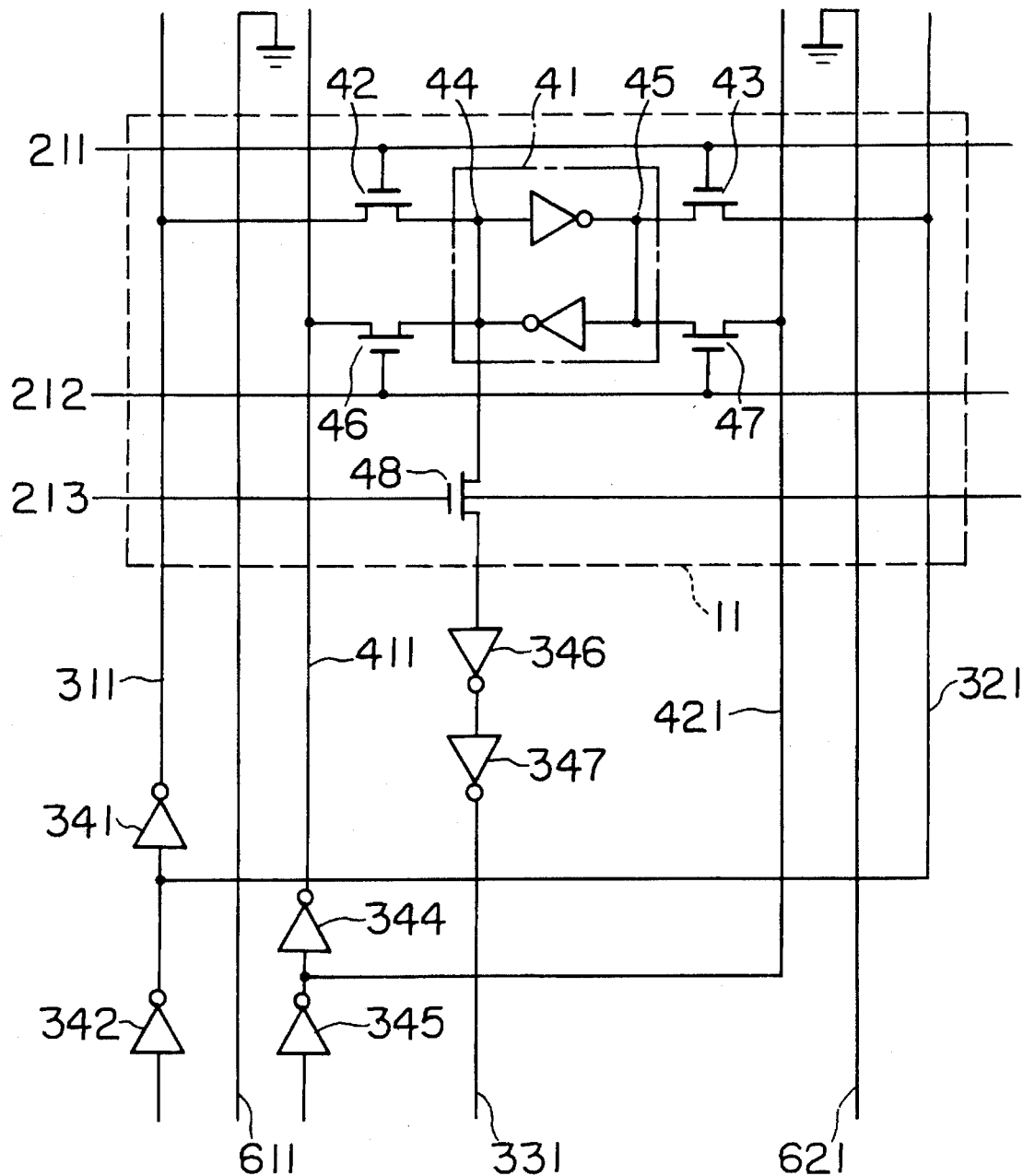
FIG. 3 shows a portion of a memory cell array of a three port RAM device.

Referring to FIG. 3, a portion of a multiport type RAM device shown therein is a portion of one of memory cells. It is true that the memory cells such as 51l–51(n–l) are arranged in a matrix with ground lines being arranged between adjacent columns, in the similar manner as shown in FIG. 2.

The multiport type RAM shown in FIG. 3 is for three ports. That is, the RAM has first and second writing word lines 21l and 212 for first and second ports and one reading word line 213 for third port for each of rows. Paired digit lines 31l and 32l as a first write signal line pair are connected to the first and the second terminals 44 and 45 of the flipflop circuit 41 through the first and second gates 42 and 43, respectively. The first and second gates 42 and 43 are commonly connected to the first writing word line 21l and are controlled by a signal flowing therethrough from the first port. In the similar manner, another paired digit lines 41l and 42l as a second write signal line pair are connected to the first and the second terminals 44 and 45 of the flipflop circuit 41 through the third and fourth gates 46 and 47, respectively. The third and fourth gates 46 and 47 are commonly connected to the second writing word line 212 and are controlled by a signal flowing therethrough from the second port.

The paired digit lines 31l and 32l are connected to each other through an inverter circuit 34l and is connected through an inverter circuit 342 to a data amplifier (not shown but 91 in FIG. 1) for the first port (71 in FIG. 1). Data signals on the digit lines 31l and 32l have different levels from each other, or inverted phases. In detail, when the data signal on the line 311 is "1" or "0" signal, the data signal on line 32l is "0" or "1". The paired digit lines 41l and 42l are also connected to each other through an inverter circuit 344 and is connected through an inverter circuit 345 to another data amplifier (not shown but 92 in FIG. 1) for the second port (72 in FIG. 1). Data signals on the digit lines 41*l* and 42*l* also have different levels from each other.

A single read signal line 33*l* extends along and for one column of the matrix. The read signal line 33*l* is connected to second terminal 45 through a fifth gate 48 in each memory cell in the column. The fifth gate 48 is connected to the reading word line 213 and controlled by a signal flowing therethrough from the third port (73 and 83 in FIG. 1). When the signal flows through the reading word line 213, the fifth gate 48 opens and the potential voltage level is supplied to the read signal line 33*l* from the first terminal 44 of the flipflop circuit 41 through the opened gate 48. The potential voltage level is supplied to a sense amplifier (not shown but 93 in FIG. 1) as a read data signal.

Figure 4:
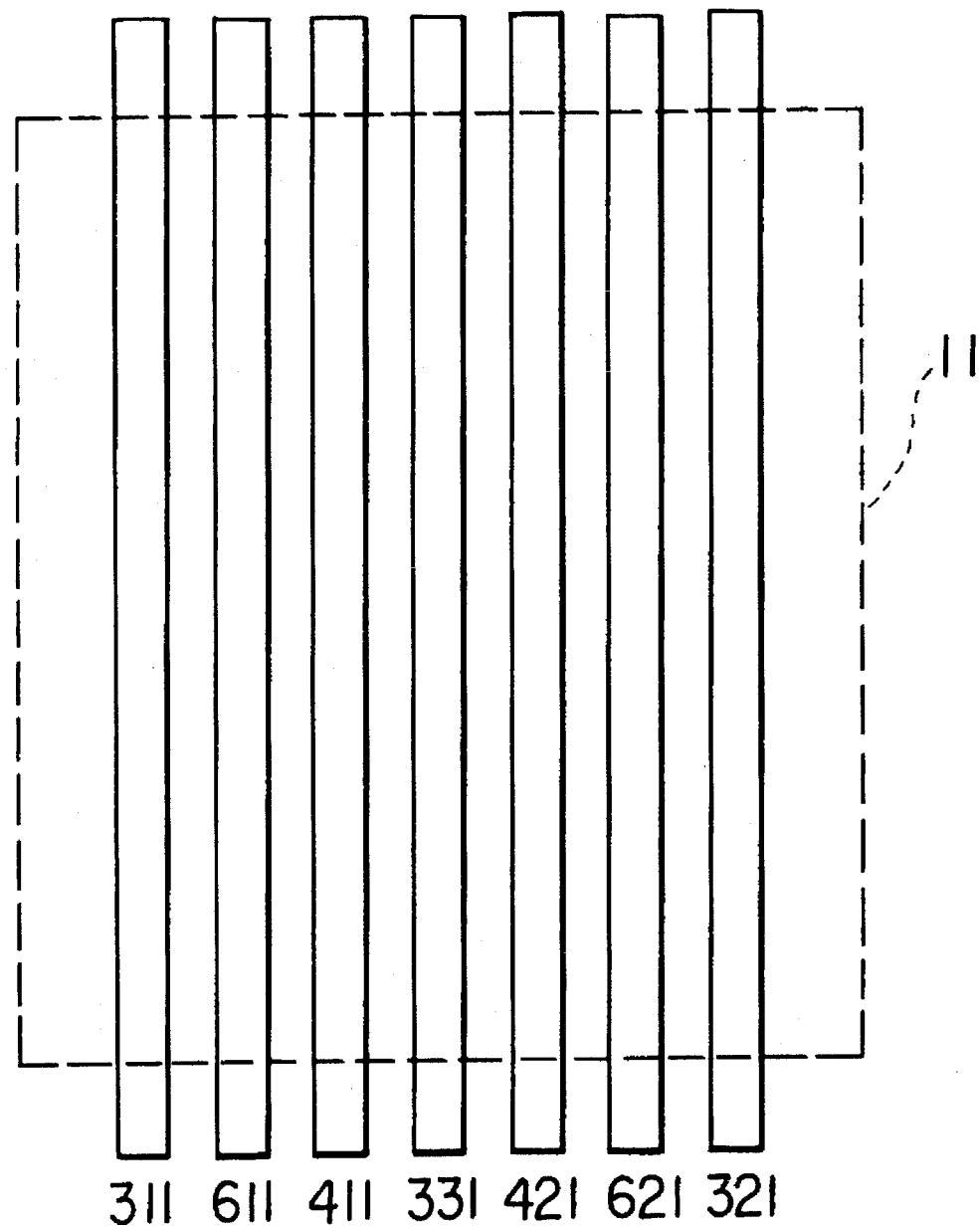
FIG. 4 shows a mask pattern of a memory cell shown in FIG. 3.

Paired digit lines 31*l* and 32*l* of the first write signal line pair are disposed at opposite sides of the flipflop circuit 41 and paired lines 41*l* and 42*l* of the second write signal line pair are also disposed at opposite sides. At both sides of the flipflop circuit 41, digit lines for different ports are disposed adjacent each other and, therefore, have a problem of cross talk between them. In order to prevent the cross talk, ground lines 61*l* and 62*l* are formed to extend spaces between adjacent digit lines 31*l* and 41*l* and between adjacent digit lines 32*l* and 42*l*, respectively. A mask pattern of the memory cell 11 and various lines of FIG. 3 is shown in FIG. 4 with the same reference numerals in FIG. 3.

The provision of the ground lines results in increase of an area of one memory cell and increase of size of the RAM device. A layout size of the mask pattern shown in FIG. 4 is 20 μm×20 μm.

Figure 5:
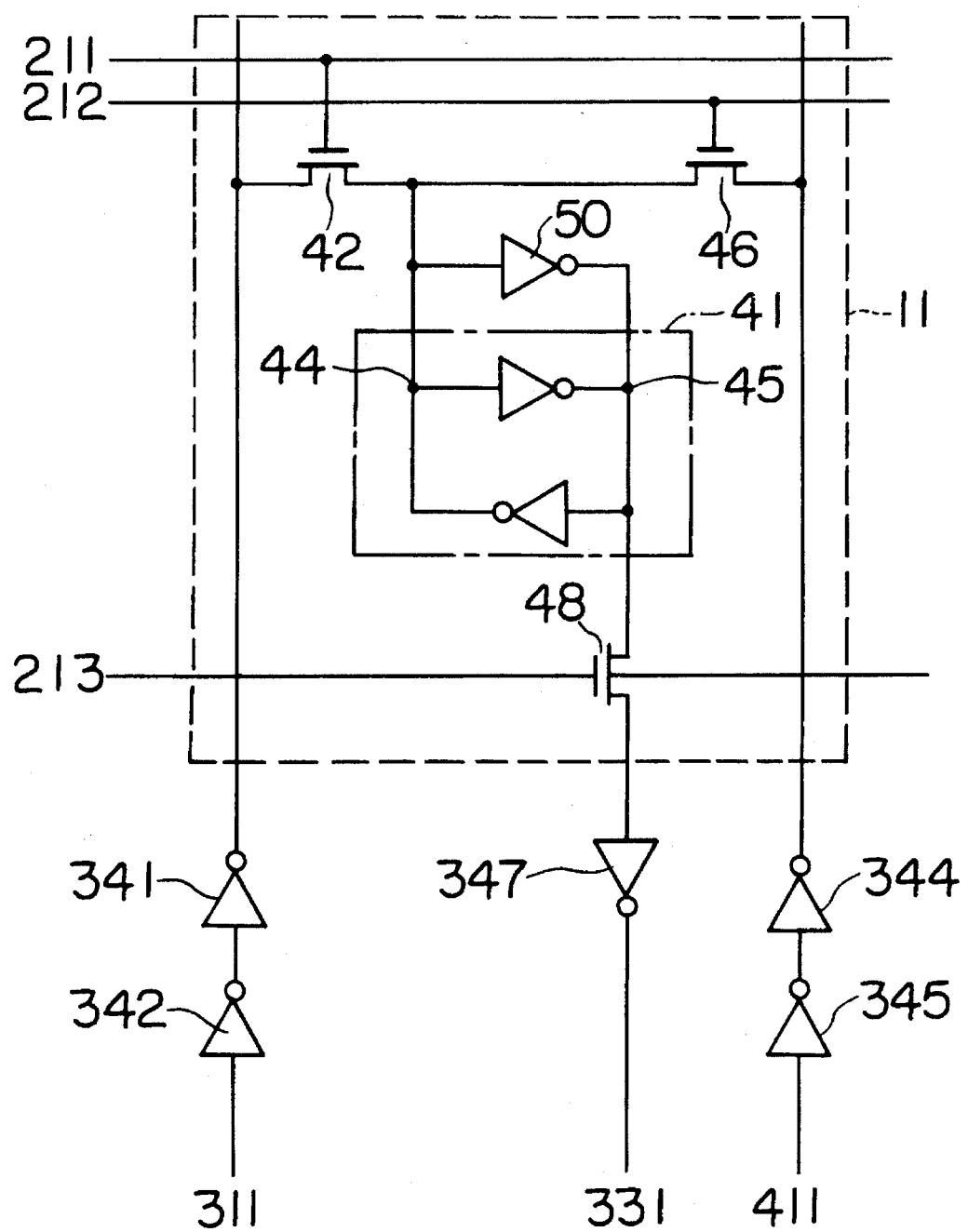
FIG. 5 shows a memory cell portion in a three port RAM device according to one embodiment of the present invention.

Referring to FIG. 5, a portion shown therein is one memory cell portion of a three port RAM device according to one embodiment of the present invention. It is needless to say that a plurality of memory cells are arranged in a matrix in the similar manner shown in FIG. 2 to form a memory cell array.

It will readily be seen that the memory cell shown in FIG. 5 is similar to but simpler than the memory cell shown in FIG. 3. The similar parts are shown by the same reference numerals.

The memory cell 11 comprises a flipflop circuit 41 as a data holding element which has a first and a second terminal 44 and 45 like in FIG. 3, and an inverter circuit or a NOT gate 50 which connects the first terminal 44 with the second terminal 45 of the flipflop circuit 41. Due to use of the inverter circuit 50, paired digit lines (31*l* and 32*l*, and 41*l* and 42*l* in FIG. 3) are not used for transmission of the write data signals from individual ports, but a first single digit line is used for one port. That is, a single write signal line 31*l* is extended in one column for the first port and is connected to the first terminal 44 of the flipflop circuit 41 through a gate 42, while a second single write signal line 41*l* is also extended in the column for the second port and is also connected to the first terminal 44 of the flipflop circuit 41. Gates 42 and 46 are connected to first writing word line 21*l* and the second writing word line 21*2*, respectively, and are controlled by the signals flowing therethrough.

In operation, according to writing instruction through the first port (71, 81 in FIG. 1), the first writing word line 21*l* is activated and the gate 42 as a first writing gate is opened. While, first write data signal is applied to the first write signal line 31*l* from the first port (71, 91 in FIG. 1) and is applied to the first terminal 44 through the gate 42 opened. At the same time, the first data signal is inverted by the inverter circuit 50 and is applied to the second terminal with an inverted phase. In detail, when the first data signal is "1" signal and is applied to the first terminal 44, "0" signal is applied to the second terminal 45. As a result, "1" signal and "0" signal are held at the first terminal 44 and the second terminal 45 of the flipflop 41. This is a same result of writing operation in the known RAM device shown in FIG. 3. Writing operation from the second port is performed in the similar manner by use of the second writing word line 21*2*, the second write signal line 41*l*, and gate 46.

The reading word line 213, the read signal line 33*l* and gate 48 are provided in the similar fashion as in FIG. 3. Therefore, reading operation from the third port are similar in the known device shown in FIG. 3.

In the embodiment, the digit lines 32*l* and 42*l* in FIG. 3 and the gates 43 and 47 are not used. The first and the second write signal lines 31*l* and 41*l* for the first and the second ports are disposed with an increased space from each other and at opposite sides of the flipflop circuit 41. Accordingly, the problem of cross talk is avoided and no ground line is provided in a space between them.

Figure 6:
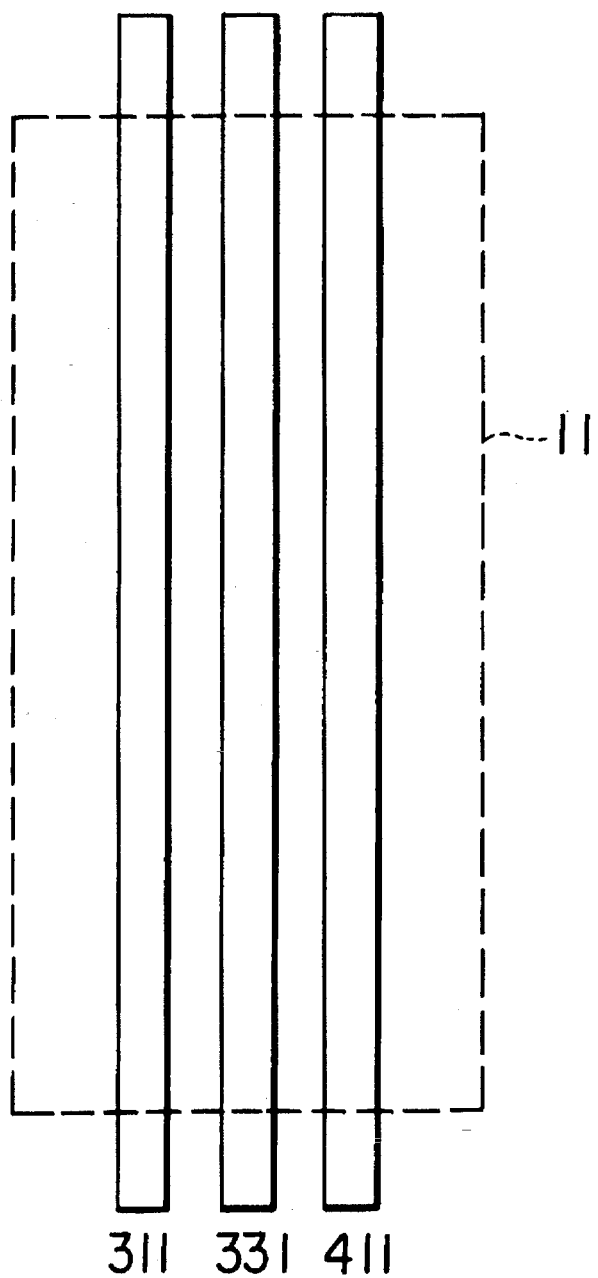
FIG. 6 shows a mask pattern of a memory cell shown in FIG. 5.

Referring to FIG. 6, a mask pattern of the memory cell shown in FIG. 5 is simple and small in comparison with that in FIG. 4. A layout size of the mask pattern shown in FIG. 6 is 20 μm×5 μm.

Therefore, it will be understood that the memory cell of FIG. 5 is small sized in comparison with the memory cell in FIG. 3. It is needless to say that the RAM device using the memory cell is also considerably small-sized.

The embodiment shown in FIGS. 5 and 6 has been described in the case where data writing is required by first and second ports, and data reading is required by the third port. However, in order to realize requirement of data reading by first and second ports and of data writing by the third port, it is readily understood by those skilled in the art that two sets of reading word line like 213, read signal line like 33*l*, and reading gate like 48 should additionally be provided for each row and column, while a set of writing word line like 21*l*, write signal line like 31*l*, and writing gate like 42 is also additionally provided for each row and column.

Further, requirement of increase or decrease of number of ports can be readily performed in the similar manner.

By use of FIG. 5, a single port RAM device according to the present invention will be described below.

In FIG. 5, it is provided that writing word line 21*2*, write signal line 41*l* and gate 46 are omitted and that the writing word line 21*l*, word signal line 31*l*, reading word line 213, and the read signal line 33*l* are accommodated in a single port. That is a structure of the memory cell portion in the single port RAM device.

In the device, a space between write signal lines 31*l* in adjacent two memory cells 11 is equal to a width of one memory cell. Accordingly, it is unnecessary to enlarge a space between adjacent two memory cells or to provide a ground line in the space.

Figure 7:
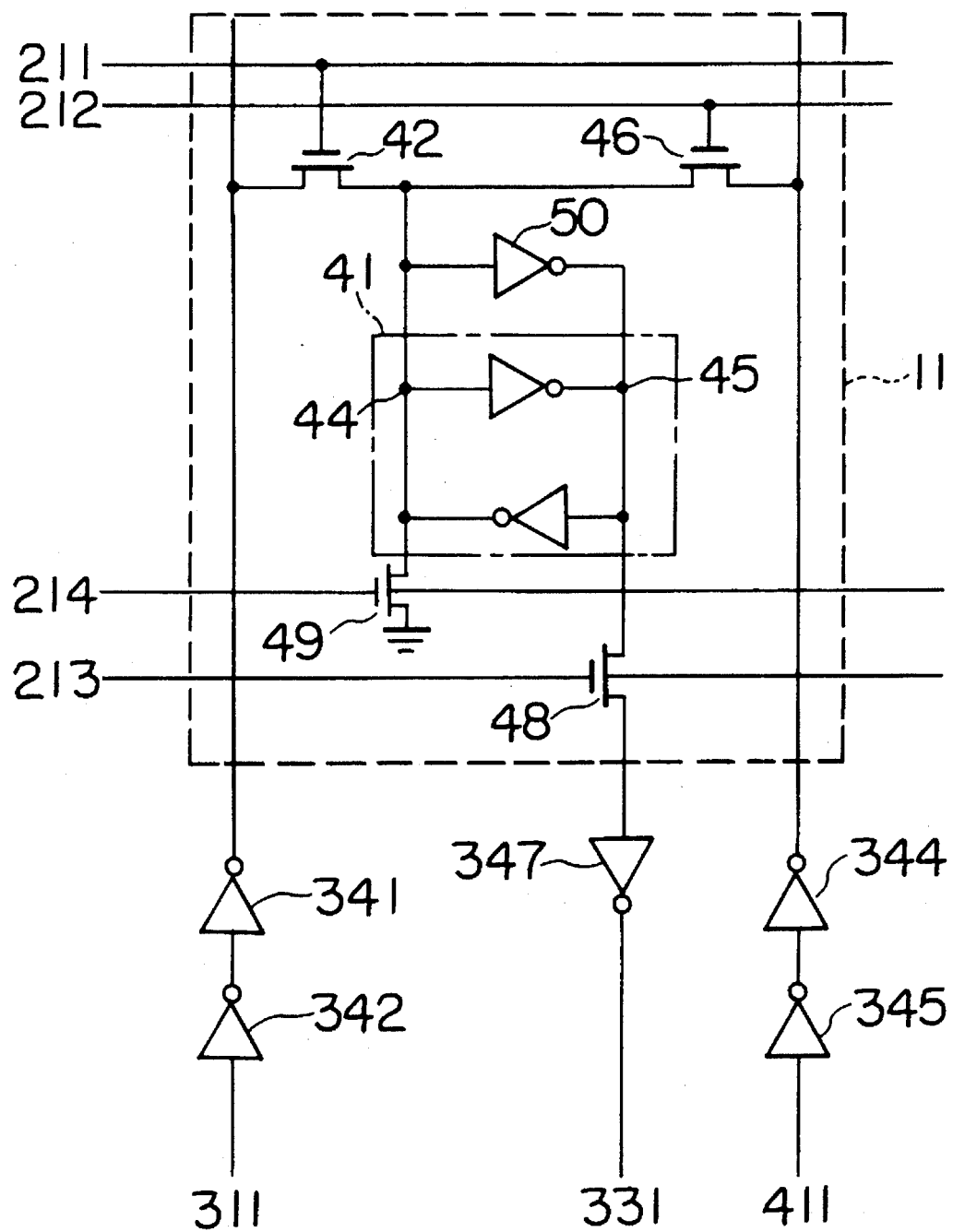
FIG. 7 shows a memory cell portion in a three port RAM device according to another embodiment.

Referring to FIG. 7, the embodiment shown therein is similar to that in FIG. 5 but is different in provision of data clearing means. The similar parts are identified by the same reference numerals and are not described for the purpose of simplification of the description.

The data clearing means comprises a clearing word line 214 is extended along each of rows of the memory cell array and is connected to a clearing gate 49. When the clearing pulse is applied to the clearing word line 214, the clearing gate 49 connects the first terminal 44 of the flipflop circuit 41 to the ground. Thus, the flipflop circuits 41 in all memory cells in the row are cleared into an initial state.

It will be understood that the mask pattern of the embodiment of FIG. 7 is also shown as in FIG. 6 and that the size of the memory cell and the RAM device can be reduced.

What is claimed is:

1. A random access memory device having a memory cell array which comprises:

a plurality of memory cells arranged in rows and columns of a matrix, each memory cell comprising a data holding element having first and second terminals disposed at opposite sides of the data holding element in a row direction, a high level and a low level signal being simultaneously applied to said first and second terminals respectively, an inverter circuit directly connected between the first and the second terminals, and a gate connected to said first terminal;

a writing word line extending along each of said rows and being connected to said gate of each of said memory cells in each of said rows for controlling said gate, said gate being opened when said writing word line is activated; and a write signal line extending as a single line along each of said columns, said write signal line being connected to said gate of each of the memory cells in each of said columns, whereby a data signal from said single line is applied to said first terminal of said data holding element in each of said memory cells when said gate is opened, said data signal being inverted by said inverter circuit and being applied to said second terminal of said data holding element.

2. A random access memory device as claimed in claim 1 which further comprises:

a reading word line extending along each of said rows;

each of said memory cells further having a reading gate connected to said second terminal, said reading gate being connected to said reading word line and being opened when said reading word line is activated; and a read signal line extending along each of said columns and connected to said reading gate of each of said memory cells in said each column, whereby the data signal held at said first terminal of each of said memory cells is read out onto said read signal line when said reading gate is opened.

3. A random access memory device having a plurality of ports and a memory cell array which comprises:

a plurality of memory cells arranged in rows and columns of a matrix, each memory cell comprising a data holding element having first and second terminals disposed at opposite sides of the data holding element in a row direction, a high level and a low level signal being simultaneously applied to said first and second terminals respectively, an inverter circuit directly connected between the first and the second terminals, a first writing gate provided for a first one of said ports and being connected to said first terminal, and a second writing gate provided for a second one of said ports and being connected to said first terminal;

a first writing word line for said first one of the ports extending along each of said rows and being connected to said first writing gate of each of said memory cells in each of said rows for controlling said first writing gate, said first writing gate being opened when said first writing word line is activated;

a first write signal line extending as a single line for said first port, said first write signal line being connected to said first writing gate of each of the memory cells in each of said columns, whereby a first data signal from said first write single line is applied to said first terminal of said data holding element in each of said memory cells when said first writing gate is opened, said first data signal being inverted by said inverter circuit and being applied to said second terminal of said data holding element; and a second write signal line extending as a second single line for said second port, said second write signal line of said second single line being connected to said second gate of each of said memory cells in each of said columns, whereby a second data signal transmitting from said second port onto said second single line is applied to said first terminal of said holding element in each of said memory cells when said second gate is opened, said second data signal being inverted by said inverter circuit and being applied to said second terminal of said data holding element.

4. A random access memory device as claimed in claim 3, which further comprises:

a reading word line being for a third port of said ports and extending along each of said rows;

each of said memory cells further having a reading gate connected to said second terminal, said reading gate being connected to said reading word line and being opened when said reading word line is activated; and a read signal line for said third port and extending along each of said columns and connected to said reading gate of each of said memory cells in said each column, whereby the data signal held at said first terminal of each of said memory cells is read out onto said read data signal line when said reading gate is opened.

5. A random access memory device as claimed in claim 1, which further comprises:

each of said memory cells further having a clearing gate which is connected between said first terminal and a ground;

a clearing word line extending along each of the rows and connected to said clearing gate to control said clearing gate into an ON condition when said clearing word line is activated, whereby said data holding element is cleared.

6. A random access memory device as claimed in claim 3, which further comprises:

a clearing gate in each of said memory cells connected between said first terminal and a ground; and a clearing word line extending along each of the rows and connected to said clearing gate to control said clearing gate into an ON condition when said clearing word line is activated to clear said data holding element.

7. A single port RAM having a plurality of memory cells arranged in m rows and n columns, wherein m and n are positive integers greater than one, each of said memory cells comprising:

only one bit line;

a word line;

a flip-flop having first and second terminals disposed at opposite sides of the flip-flop in a row direction;

a first transistor connected between said single bit line and said first terminal of said flip-flop, a gate of said first transistor being connected to said word line; and an inverter directly connected between said first and second terminals such that a data signal applied to said first terminal of said flip-flop through said bit line is inverted by said inverter and applied to said second terminal of said flip-flop.

8. A single port RAM according to claim 7, further comprising:

a second transistor connected to said second terminal of said flip-flop;

a read signal line connected to the second terminal through said second transistor, the second transistor being controlled by a reading word line; and a clearing gate connected between the first terminal and ground, the clearing gate being controlled by a clearing word line.

9. A memory device having a plurality of memory cells, each cell having at least first and second writing ports and one reading port, comprising:

first and second writing word lines;

first and second write signal bit lines;

each of said memory cells comprising a data holding element having first and second terminals disposed at opposite sides of the data holding element in a row direction;

first and second gates, said first gate connected between said first terminal and the first write signal bit line and said second gate connected between said first terminal and the second write signal bit line wherein said first gate is controlled by said first writing word line and said second gate is controlled by said second writing word line; and an inverter directly connected between the first and second terminals.

10. A memory device, as claimed in claim 9, further comprising a reading word line and a read signal line wherein said read signal line is connected to the second terminal through a third gate, the third gate being controlled by the reading word line.

11. A memory device as claimed in claim 9, further comprising a clearing gate connected between the first terminal and a ground, the clearing gate being controlled by a clearing word line.

* * * * *